United States Patent
Lee et al.

(10) Patent No.: US 8,036,248 B2
(45) Date of Patent: Oct. 11, 2011

(54) METHOD, APPARATUS, AND SYSTEM FOR AUTOMATIC DATA ALIGNER FOR MULTIPLE SERIAL RECEIVERS

(75) Inventors: Seung-Jong Lee, Santa Clara, CA (US); Daeyun Shim, Saratoga, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 447 days.

(21) Appl. No.: 12/260,970

(22) Filed: Oct. 29, 2008

(65) Prior Publication Data

US 2010/0103929 A1   Apr. 29, 2010

(51) Int. Cl.
*H04J 3/06* (2006.01)

(52) U.S. Cl. ........................... 370/516; 714/752

(58) Field of Classification Search .............. None
See application file for complete search history.

(56) References Cited

U.S. PATENT DOCUMENTS

| | | | |
|---|---|---|---|
| 5,408,473 A * | 4/1995 | Hutchison et al. | 370/506 |
| 6,374,386 B1 * | 4/2002 | Kim et al. | 714/786 |
| 6,690,757 B1 | 2/2004 | Bunton et al. | |
| 6,970,435 B1 * | 11/2005 | Buchanan et al. | 370/278 |
| 7,558,893 B2 * | 7/2009 | Geer | 710/71 |
| 2002/0184412 A1 * | 12/2002 | Stevens et al. | 710/30 |
| 2004/0117499 A1 * | 6/2004 | Liu et al. | 709/231 |
| 2004/0264496 A1 * | 12/2004 | Shaffer et al. | 370/464 |
| 2005/0005051 A1 | 1/2005 | Tseng | |
| 2005/0025195 A1 * | 2/2005 | Barrett et al. | 370/532 |
| 2006/0092969 A1 | 5/2006 | Susnow et al. | |
| 2006/0156083 A1 * | 7/2006 | Jang et al. | 714/700 |
| 2006/0273941 A1 | 12/2006 | Charath et al. | |
| 2007/0115974 A1 * | 5/2007 | Messenger | 370/389 |
| 2008/0123638 A1 * | 5/2008 | Liao | 370/389 |
| 2008/0169946 A1 * | 7/2008 | Shin et al. | 341/100 |

FOREIGN PATENT DOCUMENTS

| | | |
|---|---|---|
| WO | WO-01/78337 | 10/2001 |
| WO | WO-2008/026164 | 3/2008 |

OTHER PUBLICATIONS

*International Search Report and Written Opinion* for International Patent Application No. PCT/US2009/059080, mailed Dec. 23, 2010, 14 pages.

* cited by examiner

*Primary Examiner* — Phirin Sam
(74) *Attorney, Agent, or Firm* — Blakley, Sokoloff, Taylor & Zafman LLP

(57) ABSTRACT

A method, apparatus and system for employing an automatic data aligner for multiple serial receivers in serial link technologies is provided. In one embodiment, converting a transmission data path of a single bit into a parallel bit via a data aligner, wherein the data is being transmitted via one or more ports. Further, binding data transmission channels to reduce latency in transmission of the data, wherein the binding of the data transmission channels further includes inserting delay to match latency via the one or more ports.

18 Claims, 13 Drawing Sheets

METHOD, APPARATUS, AND SYSTEM FOR AUTOMATIC DATA ALIGNER FOR MULTIPLE SERIAL RECEIVERS

FIELD

Embodiments of the invention generally relate to the field of networks and, more particularly, to automatic data aligner for multiple serial receivers in serial link technologies.

BACKGROUND

Serial Port Memory Technology (SPMT) uses high speed serial link technology even in memory area. This serial link provides several benefits including low power and reduced pin counts and connects between host and memory. Although one serial link can support several Gbps of bandwidth, if memory bandwidth requirement gets higher than that supported by a single serial line, multiples serial links must be used to support the additional bandwidth requirement.

For example, referring now to FIG. 1A illustrating conventional frame aligning, a command 108 is encoded in multiple bits 110 and is sent bit by bit via a high speed link 102 as indicated by a second signal serial data 102. When this serialized data 102 arrive at the receiver side, these data bits 110 are parallelized again and stored in a bit packet, such as a 20-bit packet 112 as indicated by a third signal deserialized data 104. However, this "deserialized" 20-bit data 104 cannot be used to decode because the command 108 can start in the middle of this received data. For example, the deserialized data 104 at the receiver side is received as "fghabcde" 116 even though the host sent "abcdefgh" 118. In other words, the starting position (or header) of the command 108 is needed to be identified, while the host data 100 is sent by the host in a predefined pattern. For example, in this case, the predefined pattern is set to "abcdefgh" 118. After finding the starting position, the correct command 114 is obtained by shifting two adjacent deserialized data 104. This technique is referred to as "frame aligning", and the predefined pattern 118 used for this aligning is referred to as "SYNC" character.

If, however, a host has to send a large amount of data, the data is to be transferred via multiple serial links 152-162 as referenced in FIG. 1B that illustrates conventional frame and port aligning. Properties of multiple high speed links are different from each other. Usually a sampling front-end block (e.g., clock data recovery (CDR)) samples incoming serial data 102 and passes it to a deserializer block in a given clock. Also, flight times from the host to the receiver for each channel are not exactly the same. For example, the host sends a set of data at the same time, while one receiver samples data at a first clock and the other receiver samples it at a second clock. To compensate for this flight time difference or path difference, it is necessary to add one cycle delay 164 to the channels 158 where the data arrives earlier than the channels 162, respectively, where it arrives later. This process is referred to as "virtual lane alignment" 164 for computer expansion cards. Another alignment process 166 of seeking and aligning the header of each data segment is also performed along with the process of virtual lane alignment.

Now referring to FIG. 2, illustrating conventional process to measure and compensate path difference, to identify path differences, distinguishable predefined patterns are determined and communicated to various channels. For example, FIG. 2 illustrates a method to measure path differences and make the necessary data alignment with respect to various channels for computer expansion cards. For example, data is sent within a data stream at processing block 202, and the host inserts two COMMA patterns into the data stream at processing block 204 and sends the data at processing block 206. When a receiver probes this pattern at processing block 208, it checks the arrival time of the COMMA character on each channel or port at processing block 210. It further determines whether the same COMMA character appeared earlier at another channel at decision block 212. If yes, and there is a channel which does not yet have the COMMA character, the receiver inserts a one cycle delay for the data flowing through that channel at processing block 214. If not, the process continues with the delay.

FIG. 3 illustrates a conventional architecture 300 for providing virtual lane alignment (e.g. frame aligning and port aligning). When data is received via a serial link, it is sampled by a Clock Data Recovery (CDR) block that extracts clock (rck) from the incoming data to minimize the sampling error. Then, it passes the results of it to an aligner block with combining 4 bits. The first component of the aligner block is a deserializer 302 that combines five sequential incoming 4-bit data to 20-bit data using a depth of five shift registers 308. The second component is a frame aligner 304 to make the output start at a correct position. Since the deserializer 302 is running at a recovered clock (rck) and the frame aligner 304 is running at a system clock (clk), two registers of the five registers 308 are located to resolve the problem while crossing the clock domain. The combination may contain a register and a shifter. The third component is a port aligner 306. If a one cycle delay is required, the output from a register located in the port aligner 306 is selected instead of the data coming from the frame aligner 304.

The aligning of data (e.g., frame aligning, port aligning), or compensating skew between multiple channels, is commonly used in various serial link technologies, such as PCI-Express. However, SPMT has rather short interconnection between host and memory compared to other serial technologies, and it means that data skew on channels could be limited in relatively short amount. The difference comes out to be 0 or 1 in host clock cycle. It uses one kind of SYNC character to set up the outgoing and incoming channels and does not send distinguishable or special character to measure data skew. Thus, for example, the conventional bulky First In First Out (FIFO)-based technique cannot be applied to compensate data skew while a channel is in a setup period.

SUMMARY

A method, apparatus and system are provided for employing an automatic data aligner for multiple serial receivers in serial link technologies (e.g., computer expansion cards).

In one embodiment, a method includes converting a transmission data path of a single bit into a parallel bit via a data aligner, wherein the data is being transmitted via one or more ports, and binding data transmission channels to reduce latency in transmission of the data, wherein the binding of the data transmission channels further includes inserting delay to match latency via the one or more ports.

In one embodiment, an apparatus includes a mechanism for data alignment for multiple serial receivers, the mechanism including a data aligner to convert a transmission data path of a single bit into a parallel bit via, wherein the data is being transmitted via one or more ports, and bind data transmission channels to reduce latency in transmission of the data, wherein the binding of the data transmission channels further includes inserting delay to match latency via the one or more ports.

In one embodiment, a system includes a computer system having a processor and a memory coupled to the processor, the computer system having a mechanism for data alignment for multiple serial receivers, the mechanism including a data aligner to convert a transmission data path of a single bit into a parallel bit via a data aligner, wherein the data is being transmitted via one or more ports, and bind data transmission channels to reduce latency in transmission of the data, wherein the binding of the data transmission channels further includes inserting delay to match latency via the one or more ports.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1A:
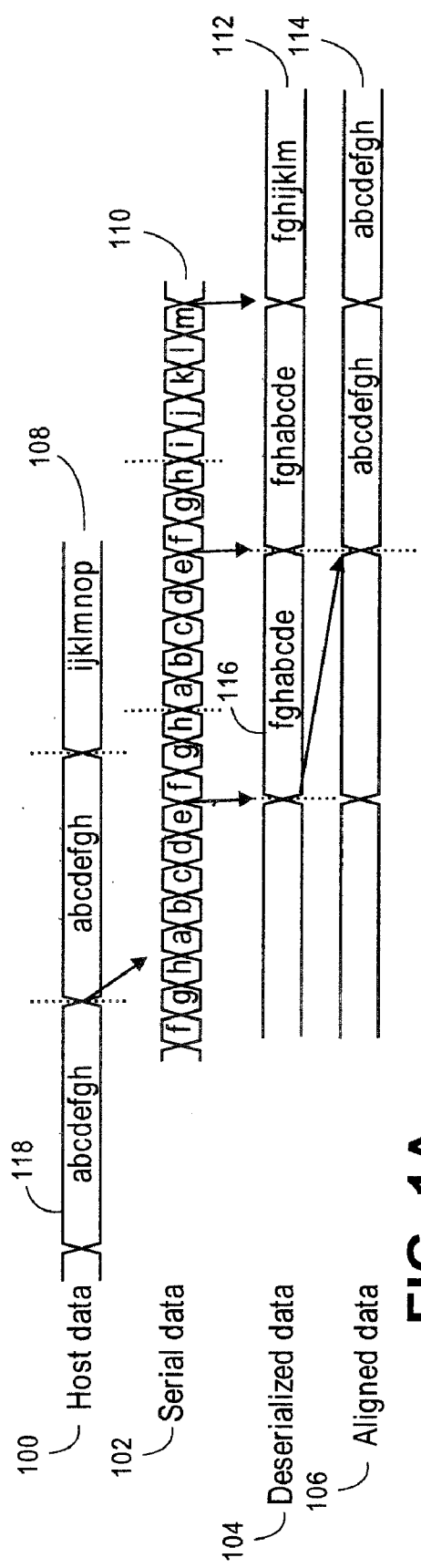
FIG. 1A illustrates conventional frame aligning.
Figure 1B:
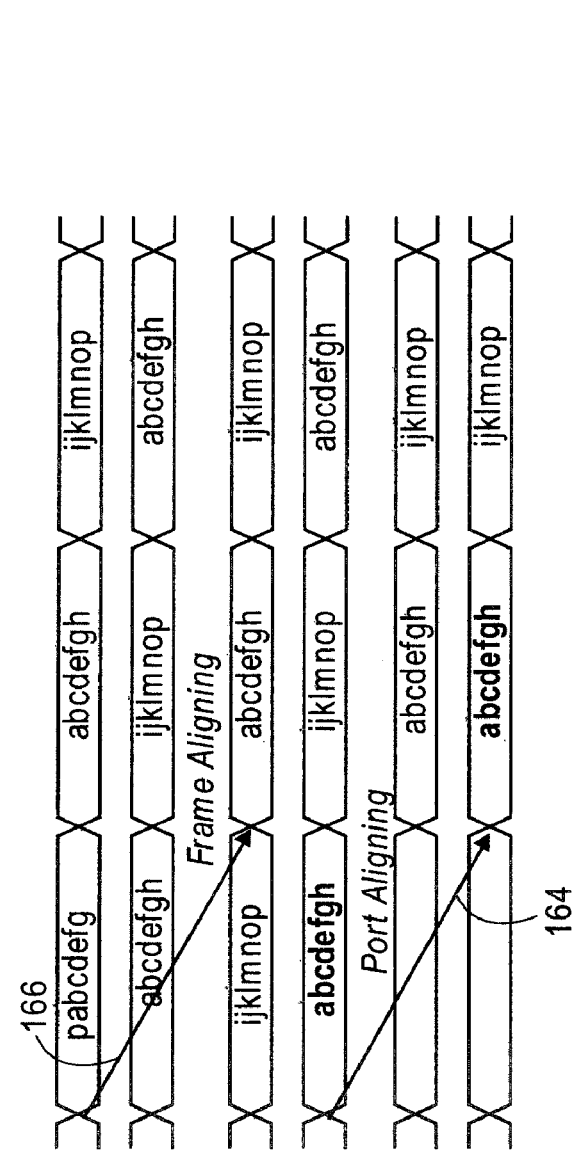
FIG. 1B illustrates conventional frame and port aligning.
Figure 2:
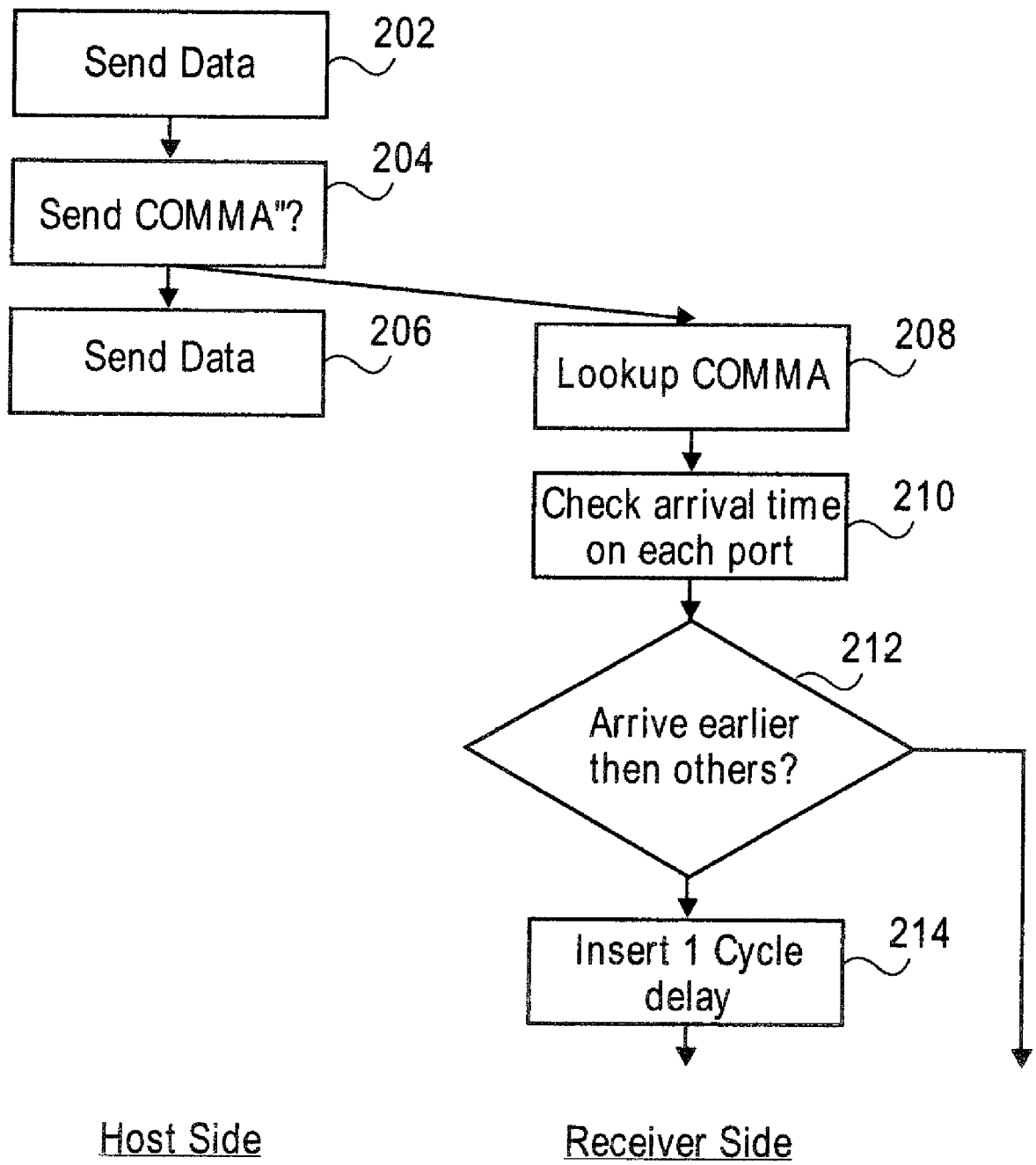
FIG. 2 illustrates conventional process to measure and compensate path difference.

Embodiments of the invention are generally directed to port multiplier enhancement.

SPMT is regarded as a new memory interface architecture, initially targeted for Dynamic Random Access Memory (DRAM) chips, that employs a serial interface architecture as opposed to a parallel interface architecture as commonly found in current memory technologies. SPMT typically uses a high speed serial link technology even in a memory area, providing the benefits of low power and reduced pin counts when connecting between a host and a memory. However, if memory bandwidth requirement gets higher than a high speed link can support (e.g., several Gbps), multiples serial links must be used. Therefore, when a host is to send a large amount of data (e.g., read-data, write-data) at once, the memory is to be provided with enough bandwidth to pass the large amount of data through the multiple serial links or serial channels. Although multiple links or channels are used physically, the passing data is treated as single large logical channel and is referred to as "port binding" because serial ports on host or memory are bounded to provide larger bandwidth.

The embodiments of the present invention improve upon SPMT and provide for greater bandwidth flexibility, significantly reduced pin count, lower power demand and savings on overall system cost. This technique is particularly crucial to mobile devices to help increase functionality while maintaining or reducing overall system cost, because a type of memory system is often an essential consideration when designing a mobile device.

In case of a single channel, any serialized data at the receiver side is to be aligned to a "frame-boundary" or "header". Also, in case of multiple-channels, each frame-aligned data is aligned to provide the same latency, referred to as "inter-channel alignment". Typically, the frame-boundary and header are checked by a receiver using a SYNC pattern (e.g., K28.5 in 8B10B coding). However, the inter-channel alignment is performed outside of PHY layer, which is implemented using FIFO to handle long delays. The technique of port-binding refers to aligning the data from multiple channels at the receiver side having same latency (inter-channel alignment) such that the received data is to have the same data from one host. If a channel (or a serial link) has latency different from that of others, the received data is not considered aligned.

The technique of aligning data, or compensating skew between multiple channels, is commonly used in other serial link technologies, such as High-Definition Multimedia Interface (HDMI) and PCI-Express. For example, the Transition Minimized Differential Signal (TMDS) technology, used in HDMI, aligns the data on three red green blue (RGB) channels with a detecting SYNC pattern 702 that appears within a pixel data stream. FIFO is placed after the PHY and the data on each channel and is aligned with a measuring position of the SYNC character. The data is aligned on multi-channels even if there is a large path difference over the channels. In case of the PCI-Express, the technique to place the data on multiple channels is referred to as "data striping" and the two SYNC characters appear periodically to measure the data skew between the channels.

However, SPMT has rather short interconnection between host and memory compared to other serial technologies, which means the data skew on channels is to be limited to a relatively short amount. The resulting difference is typically 0 or 1 in a host clock cycle. One kind of SYNC character is used to set up the outgoing and incoming channels and no distinguishable or special characters are sent to measure the data skew. This means the conventional bulky FIFO-based technique is not to be applied to compensate the data skew while the channel is in the setup period.

Figure 3:
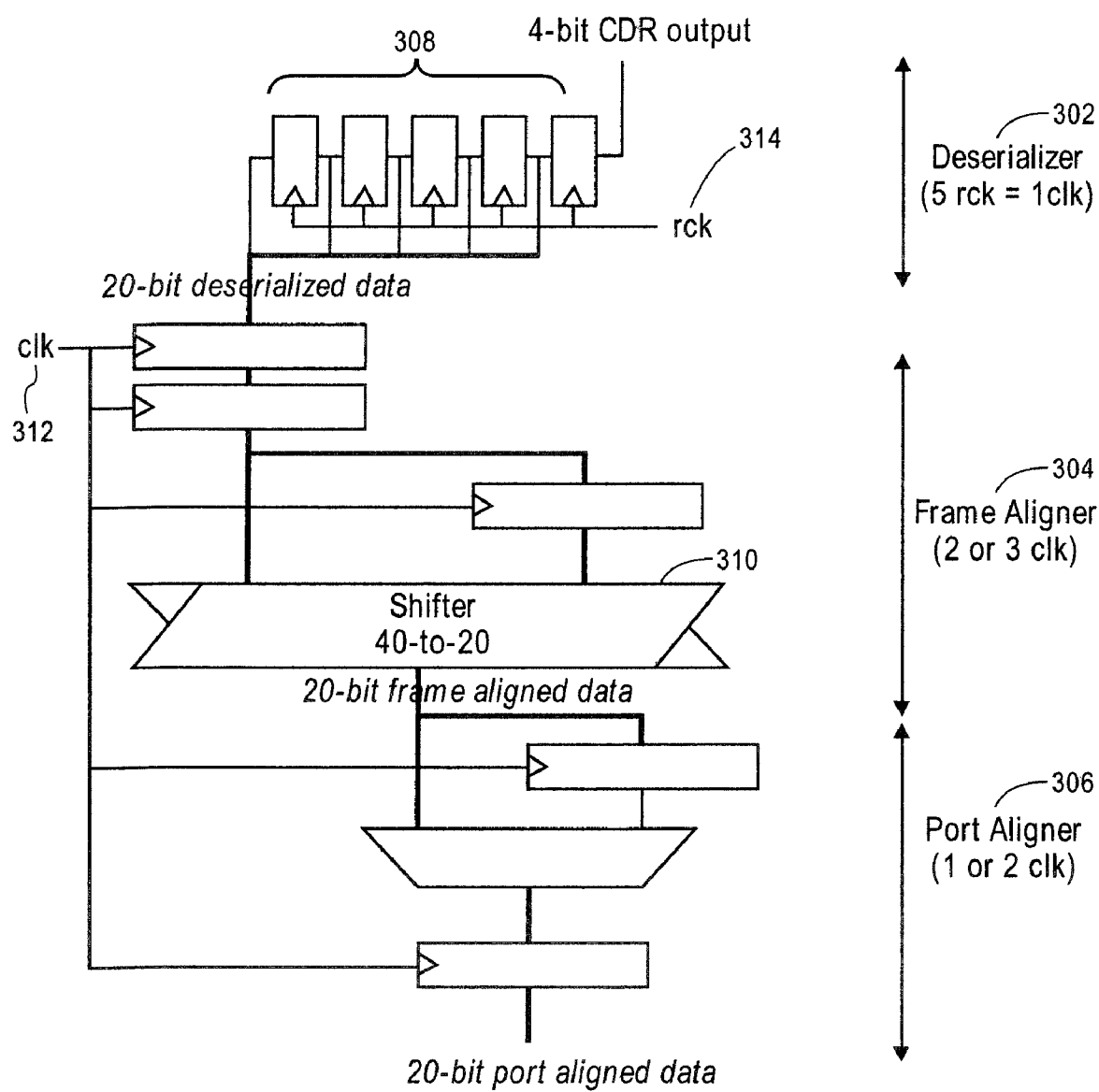
FIG. 3 illustrates a conventional architecture 300 for providing virtual lane alignment.
Figure 4:
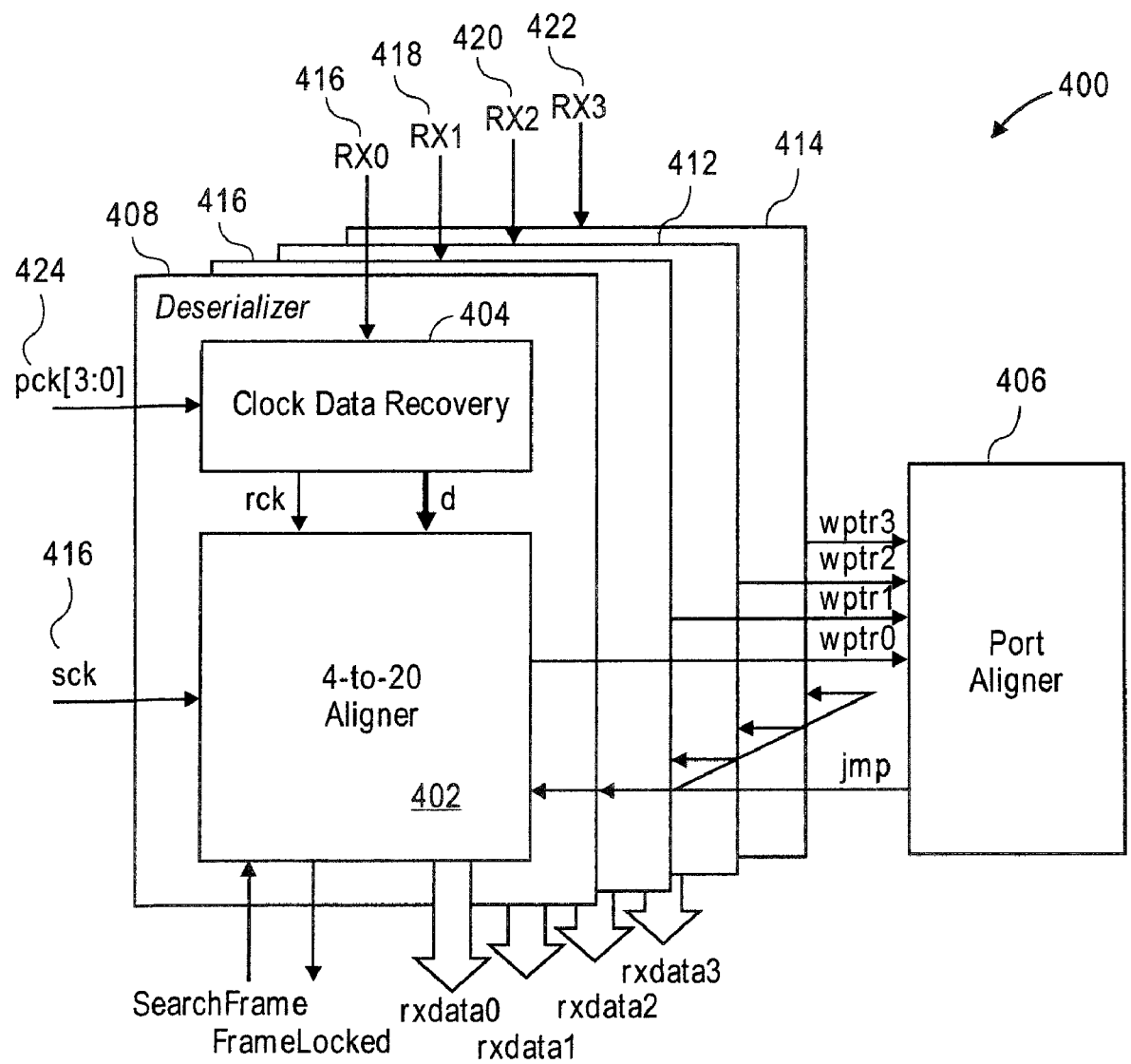
FIG. 4 illustrates an embodiment of alignment architecture for providing an aligning system to reduce latency.

FIG. 4 illustrates an embodiment of alignment architecture 400 for providing an aligning system to reduce latency. Alignment architecture 400 includes an aligner 402, CDR 404, a port aligner 406, and deserializers 408-414. In one embodiment, using the alignment architecture 400, various techniques are employed to reduce latency. For example, conventionally, it takes at least three cycles from a 4-bit CDR output to be prepared as an input to the shifter inside a frame aligner. Using the architecture 400, this latency is minimized by reducing these three cycles to a single cycle. In one embodiment, a 4-bit CDR output is put into a correct position using a single register (see FIG. 6) instead of using the shift registers as illustrated in FIG. 3; hence, replacing a large 40-bit shifter with a relatively smaller 8-bit shifter. In another embodiment, a new working clock (e.g., rck20, sck 416 etc) is generated from and replaces the two clocks, rck and clk (e.g., 312, 312 of FIG. 3), to eliminate any clock-domain crossing problems that are caused when the two clocks rck and clk are employed. With these two embodiments employing proper control signals, clock cycles for frame aligning are cut from 4 cycles to 2 cycles.

In yet another embodiment, a small delay is inserted in an input stream of data instead of having a single cycle delay in a port aligner block. For example, the target system is the underline memory and a path difference is maintained as a small amount because the host and the receiver are located in one board. Further, in this case, a determination is made as to whether there is a possibility that a cycle mismatch may occur on the receiver side while examining the pointer value used for frame aligning, which can help reduce an additional cycle. Using these techniques, port aligning is performed without any special character (e.g. COMMA in PCI-Express).

In one embodiment, having removed a special character (e.g., SYNC, COMMA) leads to (1) simplifying of the underline hardware while keeping the relevant protocol simple, and (2) reducing the time required to set up for a channel (e.g., training time). For example, within the "channel-setup-period" a start position of a data packet is detected and found. Further, the channel set-up period is to find frame-boundary or header as well as to align inter-channel data.

In one embodiment, synchronize of data is performed on multiple channels within the channel-setup-period without using a special character, while the data skew between multi-channels is maintained shorter than half of the typical host clock period. For example, a latency of 6 clock cycles resulting from using the conventional architecture may be reduced to merely 3 cycles using a novel technique according to one embodiment.

The architecture 400 having an SPMT receiver PHY consisting of four ports of deserializer 408-414 assigned to each channel and one control block that controls the delay of channels. Each port 408-414 is associated with a CDR 404 to detect one-bit serial data on a differential pair (e.g., RX0 416) with a given clock signals, pck 424, to combine the data into a 4-bit data and passes it to 4-to-20 aligner 402 using a recovered clock signal (rck). Then, the 4-to-20 aligner 402 generates 20-bit data using the incoming 4-bit data stream, and detects the start-bit-position while the channel is in channel-setup-period or training time, and aligns the data with remembered position thereafter. The port aligner 406 is responsible for generating a signal that is given to the 4-to-20 aligner to perform its tasks.

Figure 5:
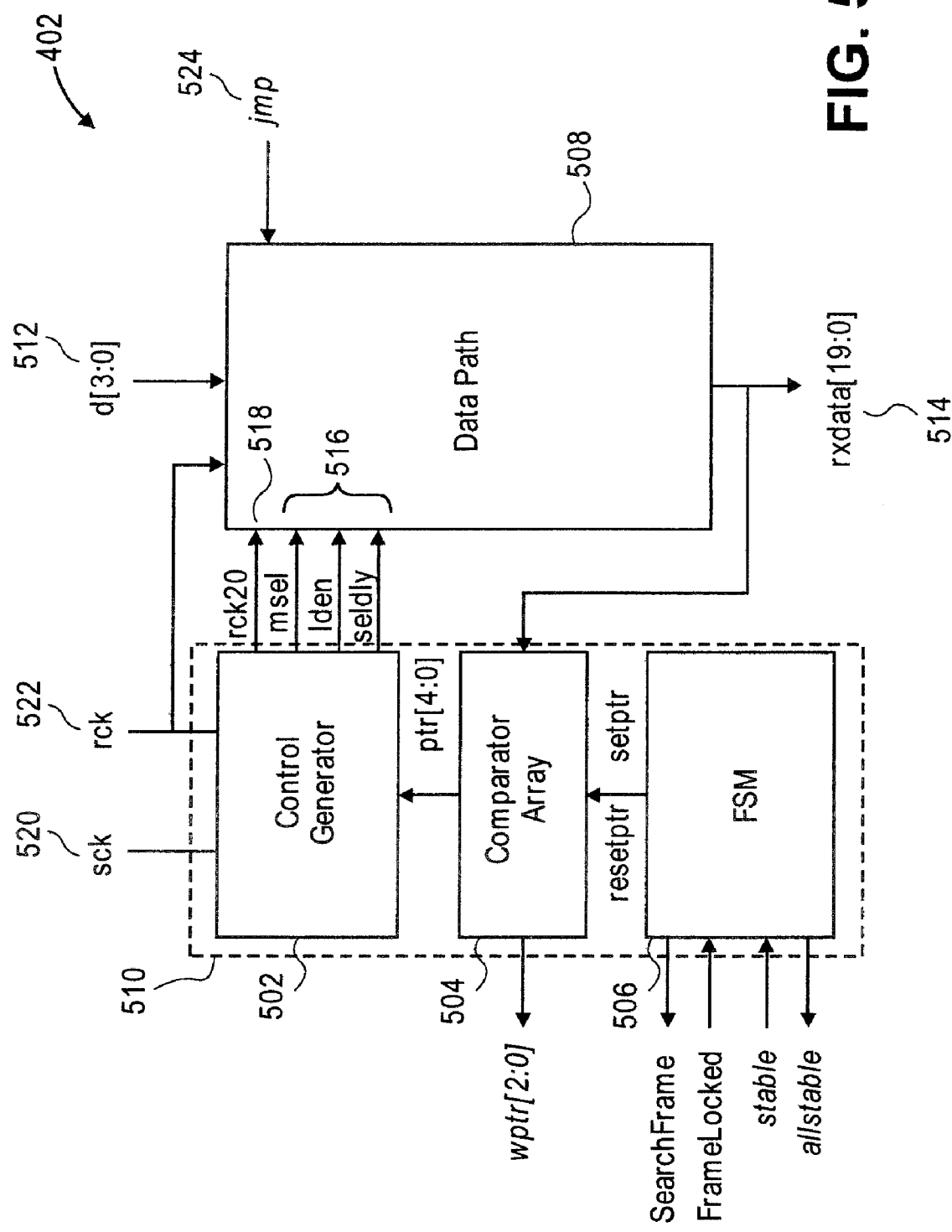
FIG. 5 illustrates an embodiment of a 4-to-20 aligner.

FIG. 5 illustrates an embodiment of a 4-to-20 aligner 402. The illustrated embodiment of the 4-to-20 aligner 402 provides various components and elements of the aligner 402, such as a data path 508 and a control path 510. The data path 508 contains various registers multiplexers, while the control path includes a control generator 502, a comparator array 504, and a finite state machine (FSM) 508. In embodiment, the control path 510 and its components are to control the workings of the data path 508 by generating proper control signals for the data path 508 and interacting with external components and machines via the FSM 508. FSM 508 provides interfacing with external components and machines.

The incoming 4-bit data stream (d[3:0]) 512 is assembled into a 20-bit stream 514 and becomes frame and port aligned with external control signals. Control generator 502 passes control signals 516 along with rck 20 518 to data path 508, and communicates an intermediate clock (e.g., rck20) which has the same frequency to system clock (sck) 520 that is synchronized to recovered clock (rck) 522. These signals 516 are used to align the data in a frame boundary. Further, a control signal, jmp 524, is received from an external port aligner to make each port aligned altogether. This is discussed with respect to FIG. 10.

Figure 6:
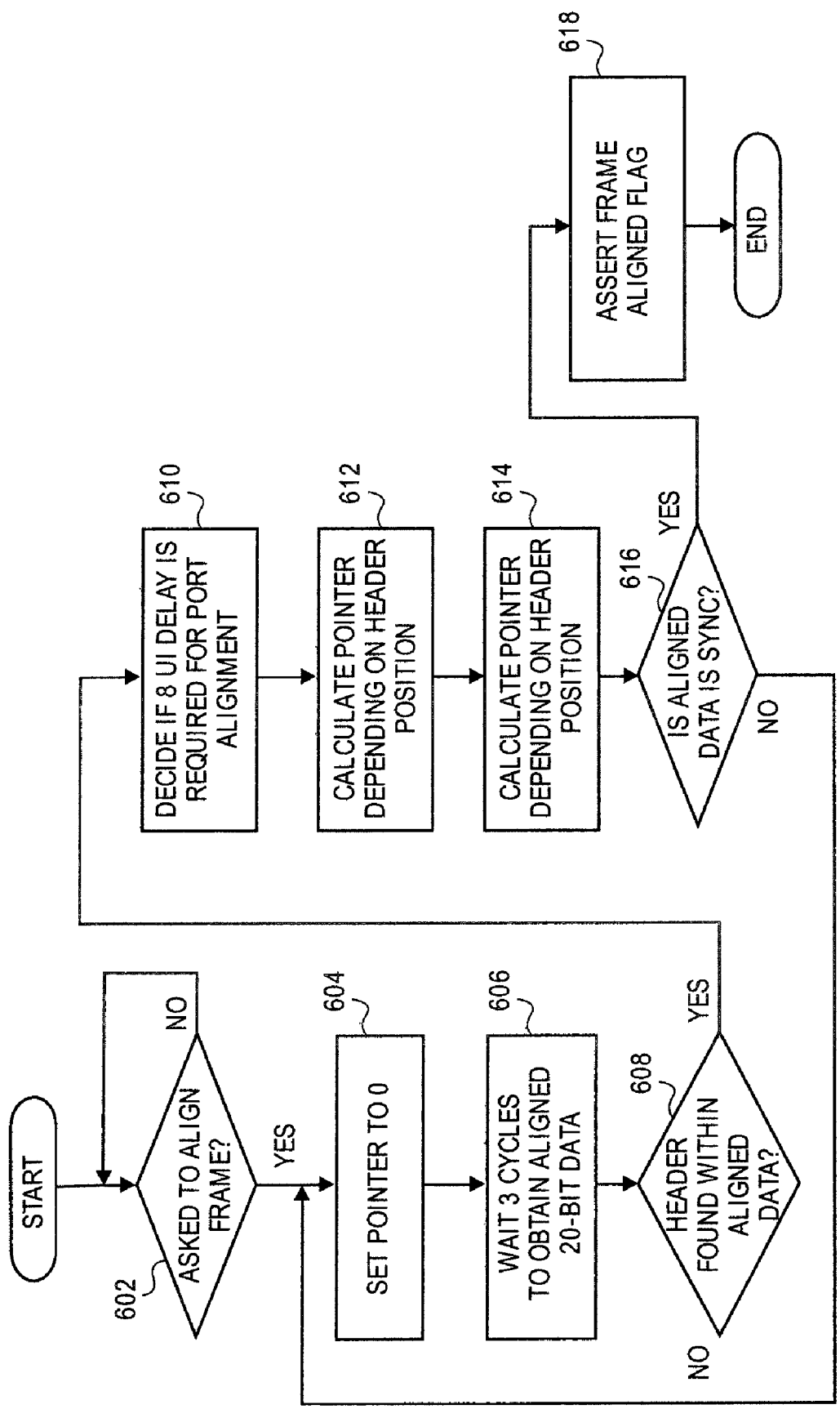
FIG. 6 illustrates an embodiment of a process for aligning using a 4-to-20 bit aligner.

FIG. 6 illustrates an embodiment of a process for aligning using a 4-to-20 bit aligner. In one embodiment, a 20-bit data stream is aligned using a 4-to-20 aligner by, for example, issuing a SearchFrame signal to run this aligner. Further, FSM is to manage the aligner globally and communicate with external hardware.

When a signal is received at a 4-to-20 bit aligner, at decision block 602, a decision is made as to whether a frame is to be aligned. If not, the process continues with returning to decision block 602. If yes, the 4-to-20 bit aligner clears the pointer first and makes data path filled with new pointer value (e.g., setting the pointer to 0) at processing block 604 and waits 3 cycles to obtain the aligned 20-bit data at processing block 606. The new aligned data with pointer '0' is checked by a comparator array to detect whether the first 4-bit of SYNC pattern exists within the unaligned 20-bit data and calculate pointer values (e.g., ptr[4:0]/wptr[2:0]) with the found position of a 4-bit pattern. This represents the first half stage of the channel setup period.

At decision block 608, a determination is made as to whether a header is found within the aligned data? If a header is not found, the process returns to processor block 604. If a header is found, the process continues at processing block 610. For example, wptr values from each port are passed to a port aligner coupled to the 4-to-20 aligner block. By checking these values, the port aligner determined whether an 8 user interface (UI) delay is to be inserted into each port at processing block 610. The port aligner block sends this instruction as a jmp signal to all components connected the 4-to-20 aligner. With this jmp signal and the already found header position, the comparator array to calculate a pointer value depending on the header position at processing block 612. The pointer value is then stored at a register. Once the pointer is determined, it waits 3 cycles to make data path filled with the new pointer value at processing block 614. This is considered the second half stage of the channel setup period.

At decision block 616, a determination is made as to whether the aligned 20-bit data is SYNC. If not, the process continues with processing block 604. If yes, a frame aligned flag is asserted at processing block 618. For example, the aligned 20-bit data is placed as an output of data path (e.g., rxdata[19:0]) after the second half stage. The 4-to-20 aligner raises a signal (e.g., FrameLocked signal) to indicate that a frame boundary is found if the aligned 20-bit data is SYNC. If not, it runs the entire process again until the SYNC is found associated with the aligned 20-bit data.

Figure 7:
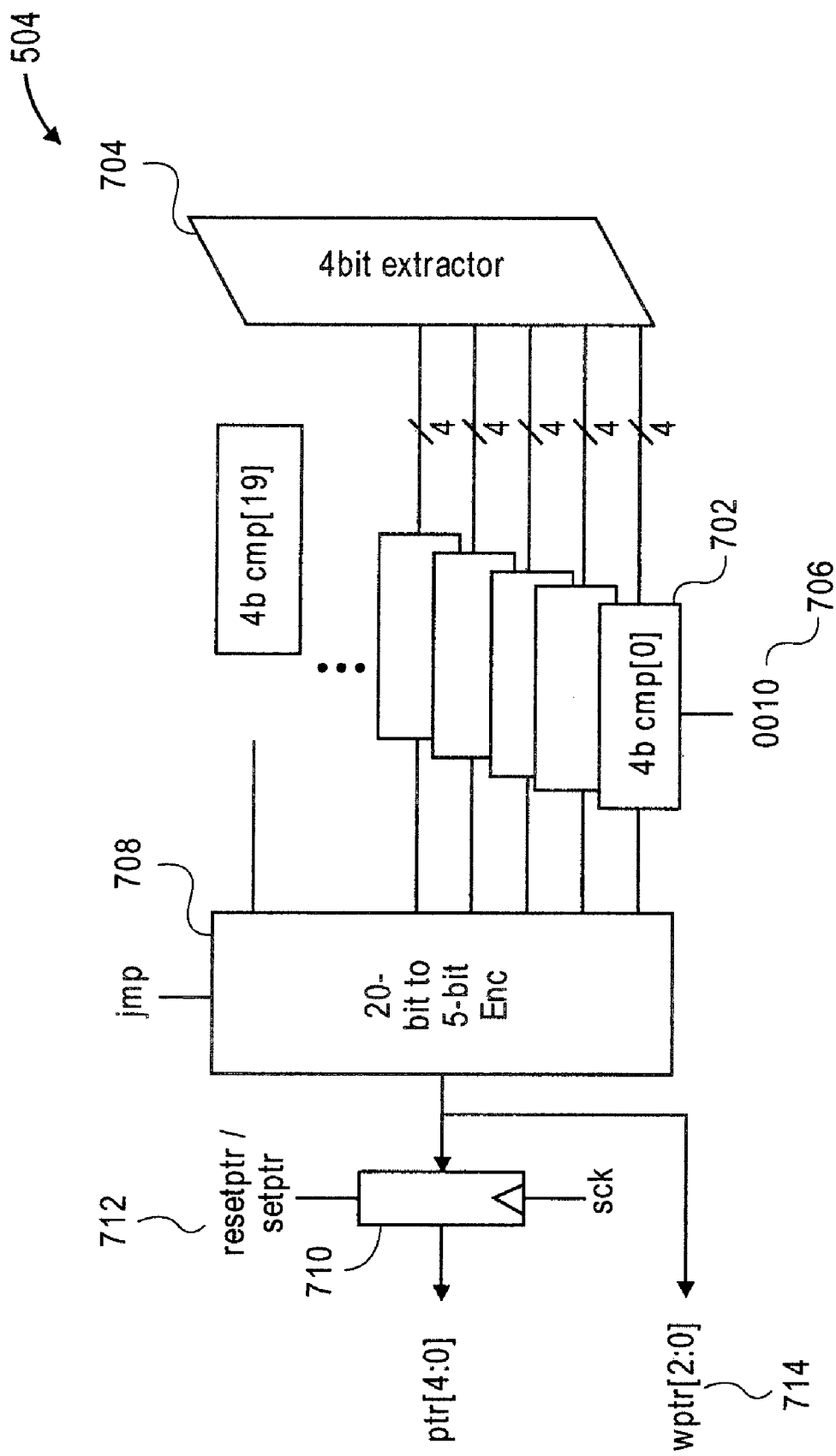
FIG. 7 illustrates an embodiment of comparator array.

FIG. 7 illustrates an embodiment of comparator array 504. In one embodiment, comparator array 504 includes any number of comparators, such as twenty 4-bit comparators 702 (e.g., 4b cmp[0]-[19]) as illustrated. A 4-bit extractor 704 extracts twenty 4-bit sequential data streams from an incoming 20-bit data stream via a 4-bit extractor 704 and these twenty 4-bit extracted data streams are passed to corresponding comparators 702. Each comparator compares each of the twenty incoming 4-bit data streams with a 4-bit constant 706 (e.g., 0010), which triggers the starting of a 4-bit SYNC character. One of these comparators may report 'matching' in a channel setup period. These comparing results are then encoded into a 5-bit digit by a 20-to-5 bit encoder 708 and latched by an output register 710 if the set is one (e.g., setptr) 712. Meanwhile, the upper 3 bits of an unlatched signal is passed as an output signal (e.g., wptr) 714 and is used by an external port aligner.

Figure 8:
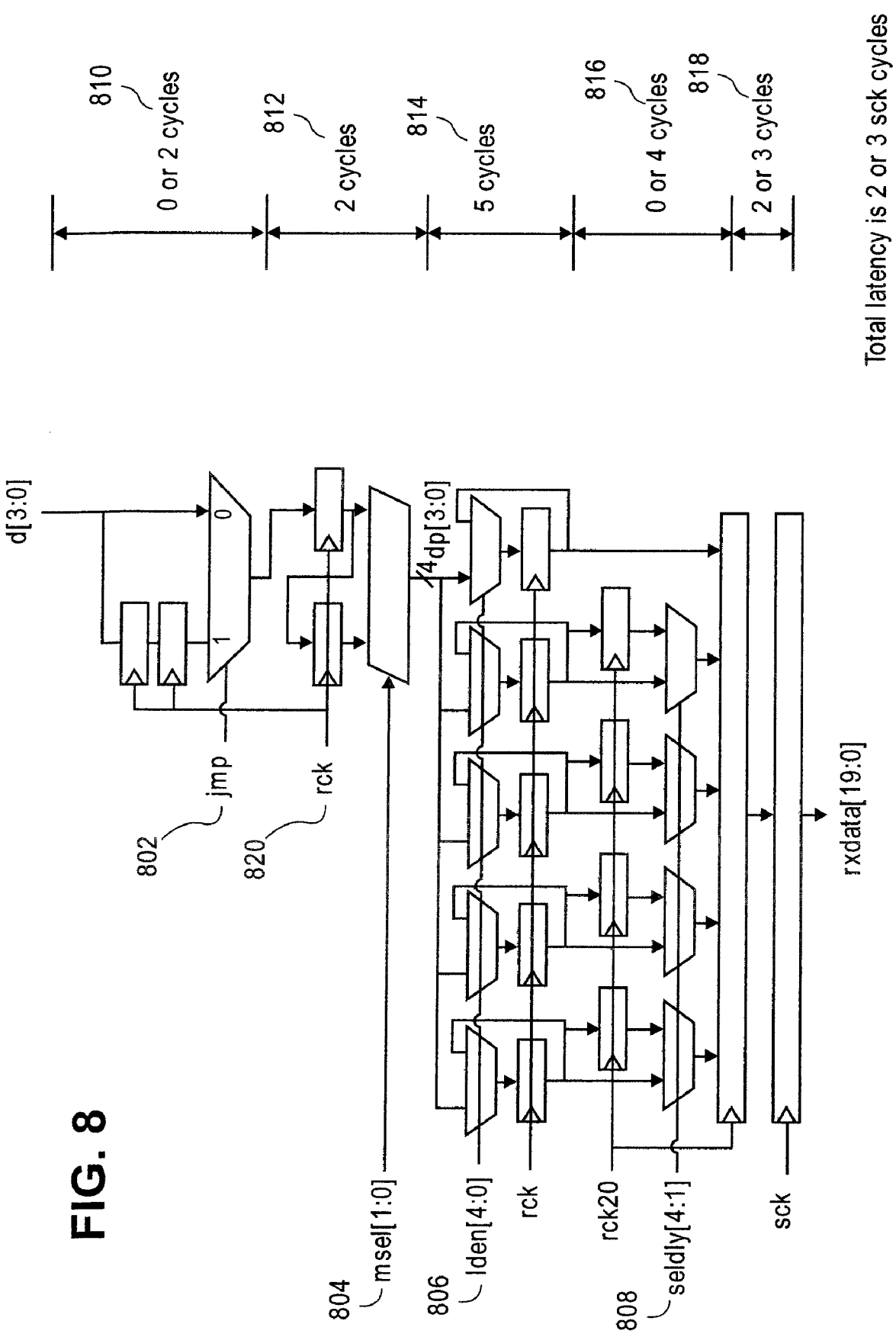
FIG. 8 illustrates an embodiment of data path.

FIG. 8 illustrates an embodiment of data path 508. As illustrated, data path 508 consists of five stages 810-818. The first stage 810 includes inserting a two cycle delay depending on a jmp signal value 802 that is received from an external port aligner coupled with data path 508, and inserts two rck cycles (or 8 UI) 820 when this is on. Functions of this stage are further discussed elsewhere in this document. The second stage 812 includes a shifter selecting a 4-bit data stream from an 8-bit input data stream that is combined with two sequential 4-bit data stream. The shifter includes an 8-to-4 shifter to replace a large conventional 40-to-20 shifter. The functions of this 8-to-4 shifter nay depend on a 2-bit msel signal value 804. The third stage 814 of data path 508 includes placing or aligning finely shifted data in proper order. The related control signal 806 (e.g., Iden) is properly generated to place the header of a received packet to be latched at the first register. In other words, data becomes aligned in two stages: once at the fine level and then again at the coarse level.

Although a data bit stream is shifted properly with the second and the third stages 812, 814 certain parts of the aligned data may have been received from a previous packet. To compensate this one cycle delay, 4-bit aligned data is selected and a one cycle delay is latched before it by using a number of multiplexers 808 (e.g., four illustrated multiplexers) is the fourth stage 816. The fifth and final stage 818 contains merely two registers that are used to hold the aligned 20-bit data.

Furthermore, the latency gets changed each time a jmp signal 802 is triggered. If the frame aligner does not need to perform frame aligning, the port aligner then performs port aligning instead. In such a situation, as detected by the port aligner, the jmp signal 802 is generated and a two cycle delay is inserted into the input data stream in the second stage 812. Since this delay is performed in rck domain 820, in one embodiment, the penalty is relatively small compared to the one imposed in a conventional system. Further, this may not be necessary when merely a single channel is employed. However, when data arrives on multiple channels, the data can be aligned with selecting a proper jmp value 802. This is further described with respect to FIG. 12.

Figure 9:
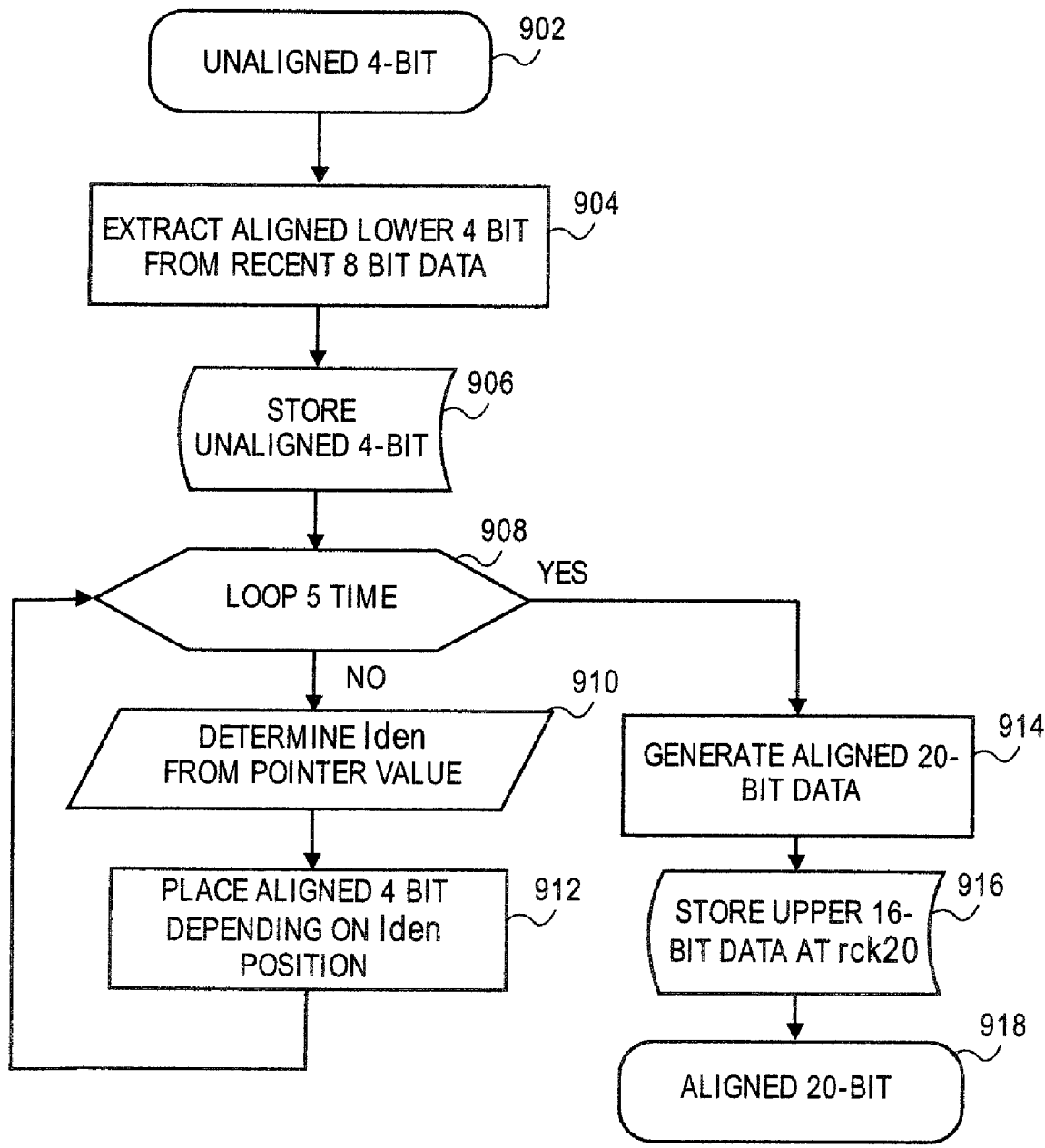
FIG. 9 illustrates an embodiment of obtaining a frame aligned 20-bit data stream.

FIG. 9 illustrates an embodiment of obtaining a frame aligned 20-bit data stream. At processing block 902, an unaligned 4-bit data stream is received. At processing block 904, an aligned lower 4-bit stream is extracted from a recent 8-bit data stream. The unaligned 4-bit data is stored at processing block 906. At decision block 908, a determination is made as to whether a loop is performed five times. If yes, an aligned 20-bit data stream is generated at processing block 914. The upper 16-bit data is stored at rck20 at processing block 916, and the aligned 20-bit data stream is provided at processing block 918.

Figure 10:
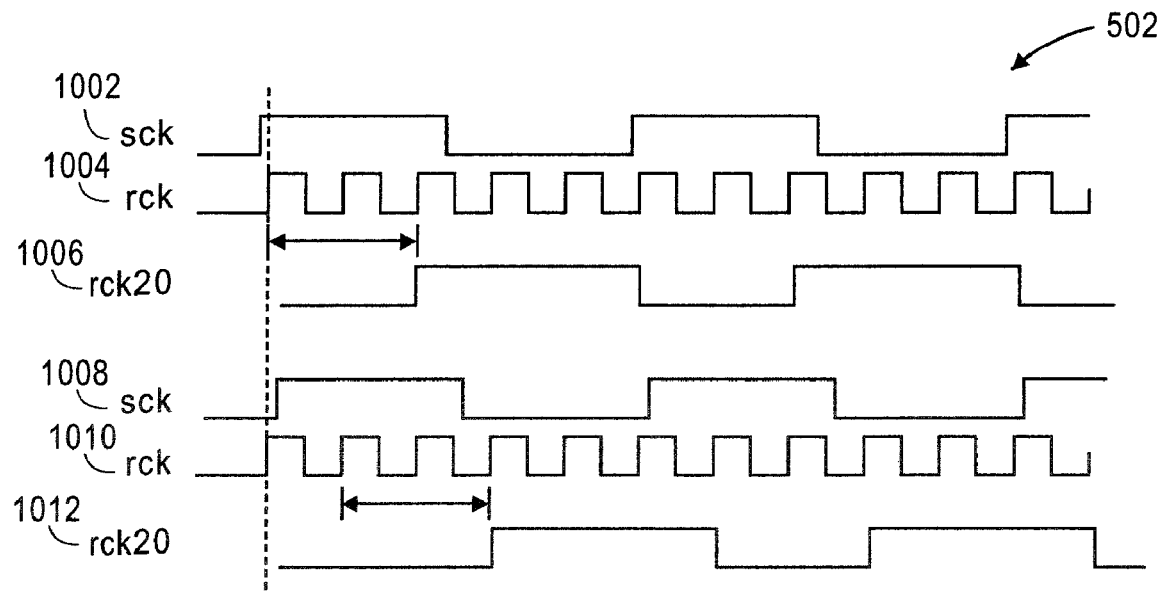
FIG. 10 illustrates an embodiment of control generator having an internal clock signal to avoid clock domain crossing problem.

FIG. 10 illustrates an embodiment of control generator 502 having an internal clock signal (e.g., rck20 1006) to avoid clock domain crossing problem. In one embodiment, two clocks, sck 1002 and rck 1004, are employed in control generator 502. Clock sck 1002 represents a system clock and FSM runs with this clock. Clock sck 1002 includes a period of 20 character symbols (e.g., 20 UI), while clock rck 1004 represents a recovered clock from CDR and includes a period of 5 UI. Further, an incoming data stream arrives in clock rck 1004. To have data path 508 (as shown in FIG. 5) extract 20-bit data from a data stream, an intermediate clock having 20 UI clock periods is used and is generated by using clock rck 1004. This clock signal is referred to as rck20 1006 and generated in control generator 502. Also, for example, the clock signal rck20 1006 has a property to be about 180 degree phase difference from clock sck 1002. Another role of control generator 502 is to generate control signals for data path 508 with a given pointer value (ptr) that comes from comparator array 504 (illustrated in FIG. 5).

Further, a tip to reduce power consumption is employed. For example, after a channel is set, comparator array is not needed and thus, the aligned 20-bit data stream is masked and passed to comparator array to reduce power consumption when a signal (e.g., framelocked signal) becomes on.

Figure 11:
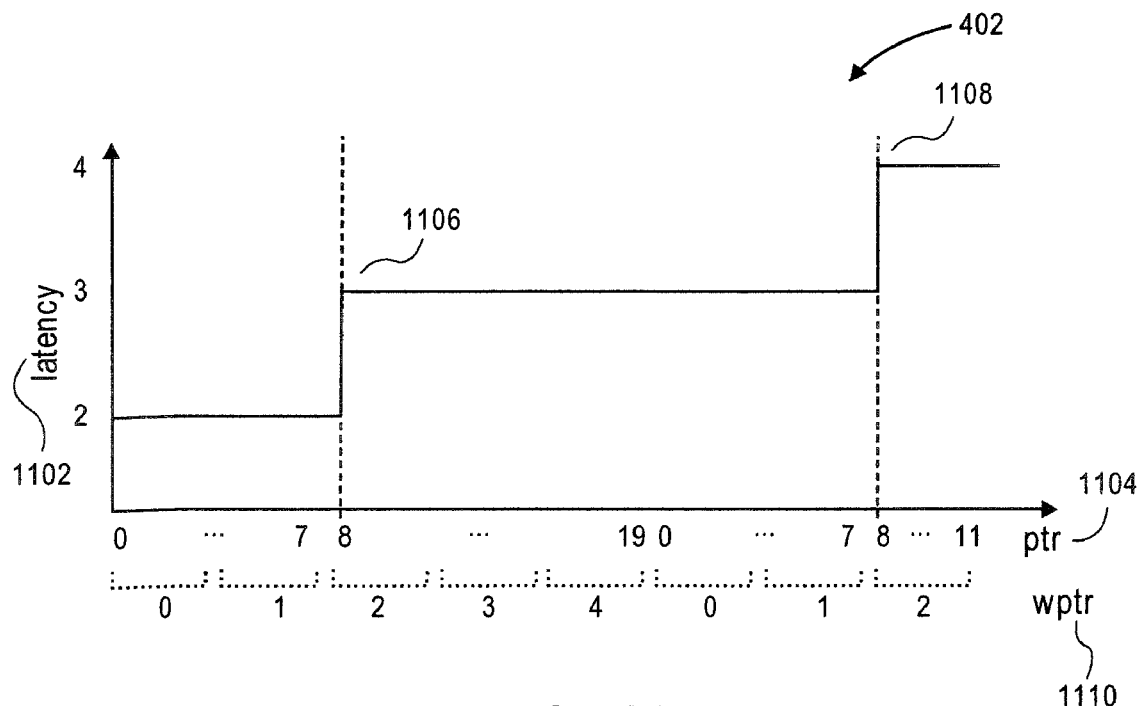
FIG. 11 illustrates an embodiment of a relationship between latency and pointer in 4-to-20 port aligner.

FIG. 11 illustrates an embodiment of a relationship between latency 1102 and pointer 1104 in 4-to-20 port aligner 402. In one embodiment, 4-to-20 port aligner 402 generates parallel data from high speed signal and passes the result to system clock domain. In other words, latency 1102 in system clock domain increases at certain positions, such as positions 1106, 1108, reflecting an increasing communication delay of high speed channel. Meanwhile, the delay on high speed channel affect location of a frame boundary, and this information can be obtained as pointer values of pointer 1104. Using the illustrated graphical relationship between latency 1102 and pointer 1104, several essential points are detected, such each latency increase 1106, 1108 reflecting a discontinuity point. In this case, latency 1102 increases at positions 1106, 1108 (at ptr 8, wptr 2).

Figure 12:
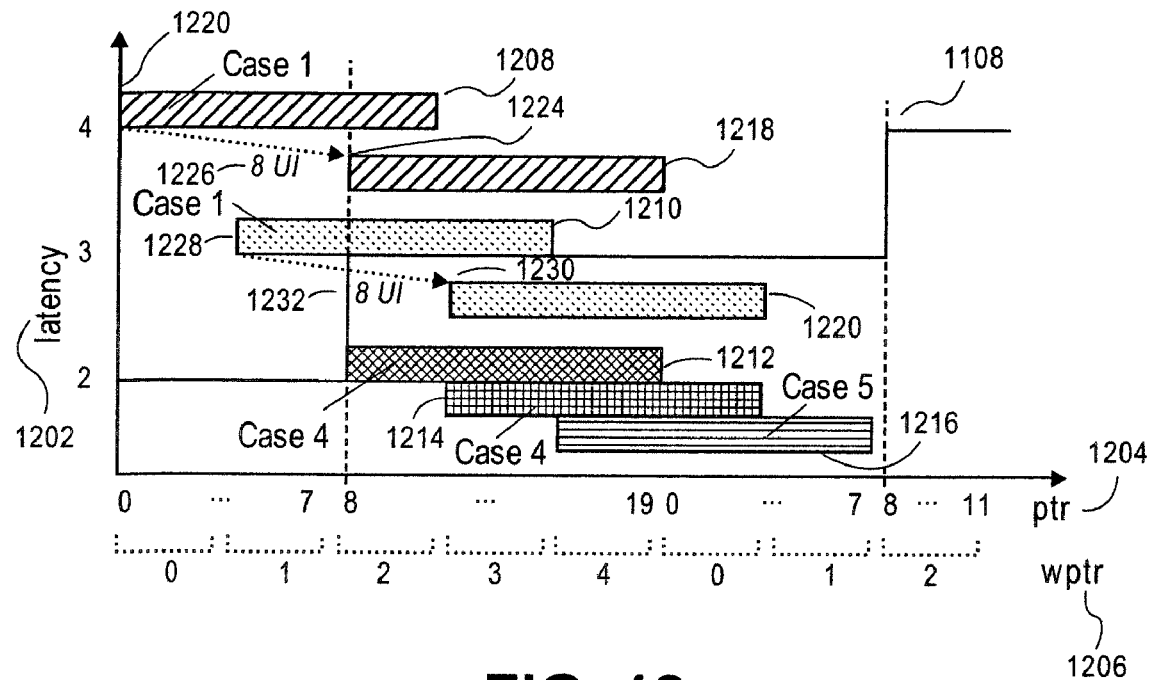
FIG. 12 illustrates an embodiment of port alignment based on pointer value over multiple ports.

FIG. 12 illustrates an embodiment of port alignment based on pointer values over multiple ports. The illustrated embodiment provides a relationship between latency 1202 and pointer 1204 (and wptr 1206) having various bars 1208-1220 reflecting various ptr values 1204 and wptr values 1206 being received from each port. For example, with respect to case 1 1208, 1218, first port 1222 of bar 1208 has a wptr value of 0, while second port 1224 of bar 1218 has a wptr value of 2, which indicates that the latencies for these two ports are different from each other. If, however, these two bars 1208, 1218 were to be shifted to the right to the safe zone, the first value of wptr 0 becomes wptr 2, while the second value of wptr 2 becomes wptr 4, and both issue the same latency. The amount necessary to shift the two bars 1208, 1218 to the two new wptr values requires two clocks of rck or 8 UI's 1226, which is one purpose for placing two registers in the first stage of data path 508.

Similarly, in case 2 1210, 1220, first port 1228 of bar 1210 is at wptr 1, while second port 1230 of bar 1220 is at wptr 3. The amount necessary to shift the two bars 1210, 1220 to the two new wptr values in a safe zone may require two clocks of rck or 8 UI's 1232. However, the remaining illustrations of case 3 1212, case 4 1214, and case 5 1216 are already placed in a safe zone and there is no need for shifting them. When comparing case 1 1208, 1218 and case 4 1214, the pointer shift may be decided depending on wptr values from other ports even if one wptr has a value of 0.

Figure 13:
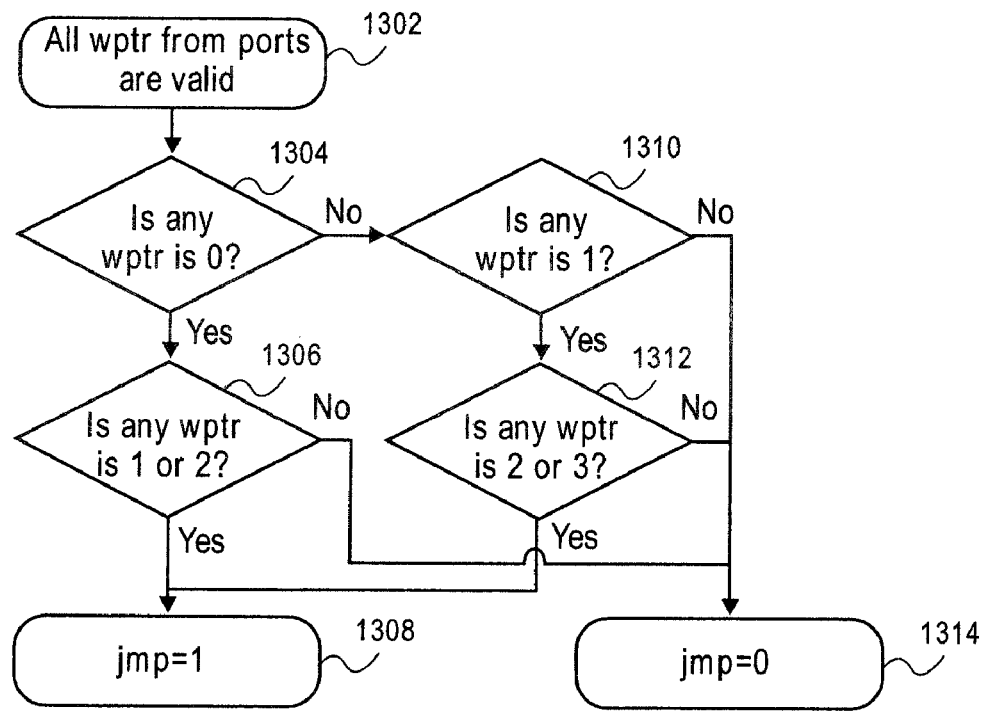
FIG. 13 illustrates an embodiment of a process associated with a jmp signal.

FIG. 13 illustrates an embodiment of a process associated with a signal (e.g., jmp signal). The illustrated process embodiment is used to decide a jmp signal value. When wptr from ports are valid at block 1302 and, for example, when a wptr becomes ready in one port, it also raises a stable signal as illustrated in FIG. 5. If all stable signals from ports are 1 at decision block 1310, then a jmp value is determined. There are two paths in the illustrated decision diagram: For example, if one of wptr is 0 at decision block 1304, and if the other wptr value equals 1 or 2 at decision block 1306, the jmp value equals 1 at block 1308. If not, the jmp values equals 0 at block 1314. On the other hand, if the value for one of wptr is 1 at decision block 1310, and if the other wptr is set at 2 or 3 at decision block 1312, the jmp value is set at 1 at block 1308. If not, the jmp value is set at 0 at block 1314. This decision may be calculated in a single cycle in parallel. It also raises an allstable signal, as shown in FIG. 5, to indicate that jmp is decided and the connected 4-to-20 aligner is made aware of it.

Figure 14:
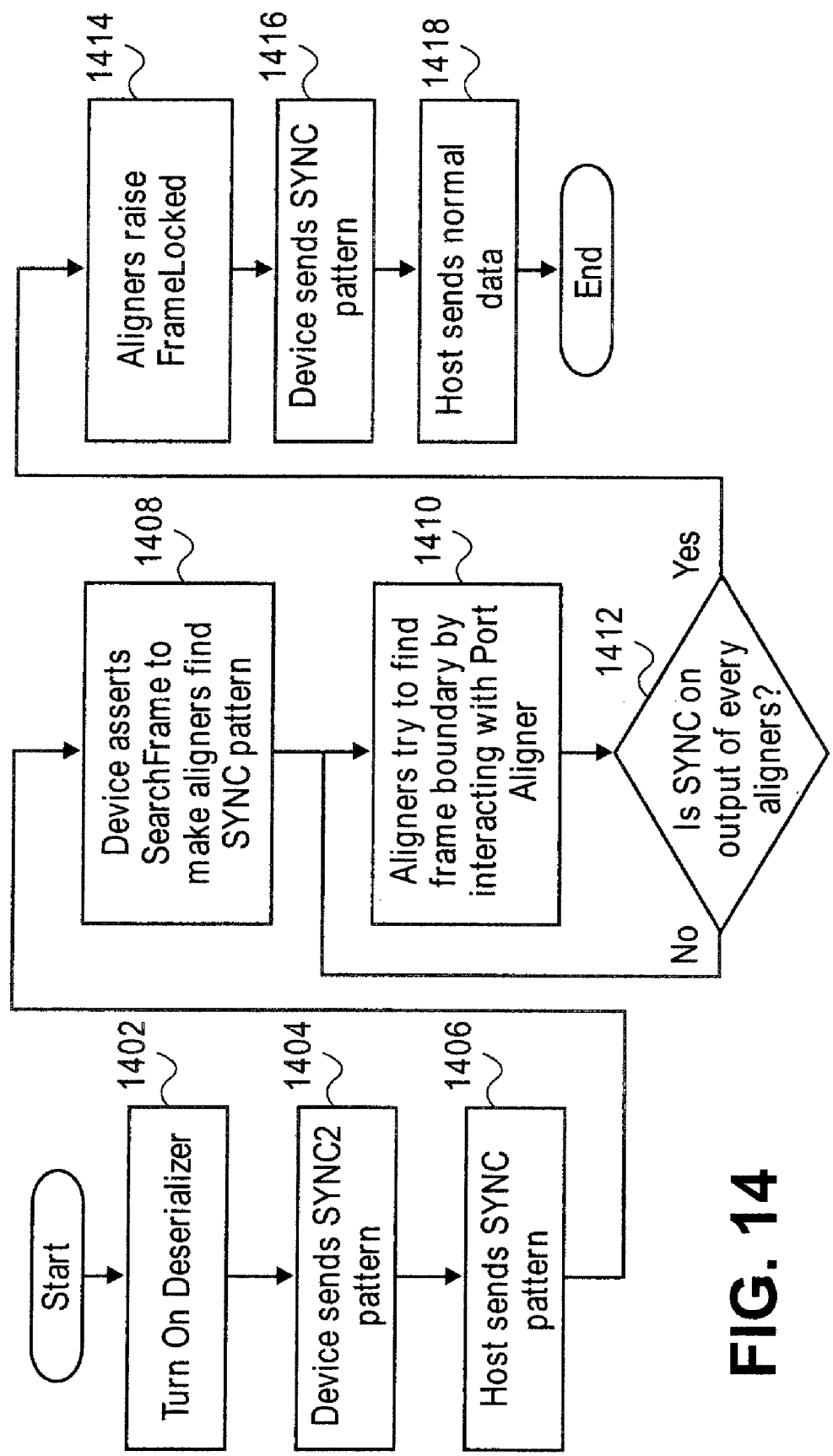
FIG. 14 illustrates an embodiment a process for performing automatic data alignment for multiple data transmission channels.

FIG. 14 illustrates an embodiment a process for performing automatic data alignment for multiple data transmission channels. At processing block 1402, a deserializer is turned on and is configured to detect a frame boundary and be ready for normal operation after it is turned on. At processing block 1404, a device is turned on and sends a SYNC2 pattern to a host at initial state. At processing block 1406, a host coupled with the device sends a SYNC pattern. The device asserts aligners (inside the device) to proceed with finding frame boundary (e.g., SearchFrame), and so the aligner seek to find a predefined sequence of SYNC patterns inside an incoming data stream at processing block 1408. At processing block 1410, the aligners interact with port aligner to find the frame boundary and achieve synchronization between ports.

At decision block 1412, a determination is made as to whether a SYNC patter is found in the output of each of the aligners. If not, the process continues with processing block 1410. If yes, the process continues with processing block 1414 where the aligners raise FrameLocked signal to inform the device. The device then begins to send SYNC patterns to the host to signal the host at processing block 1416. At processing block 1418, the host sends a start normal operation after the channel setup.

Figure 15:
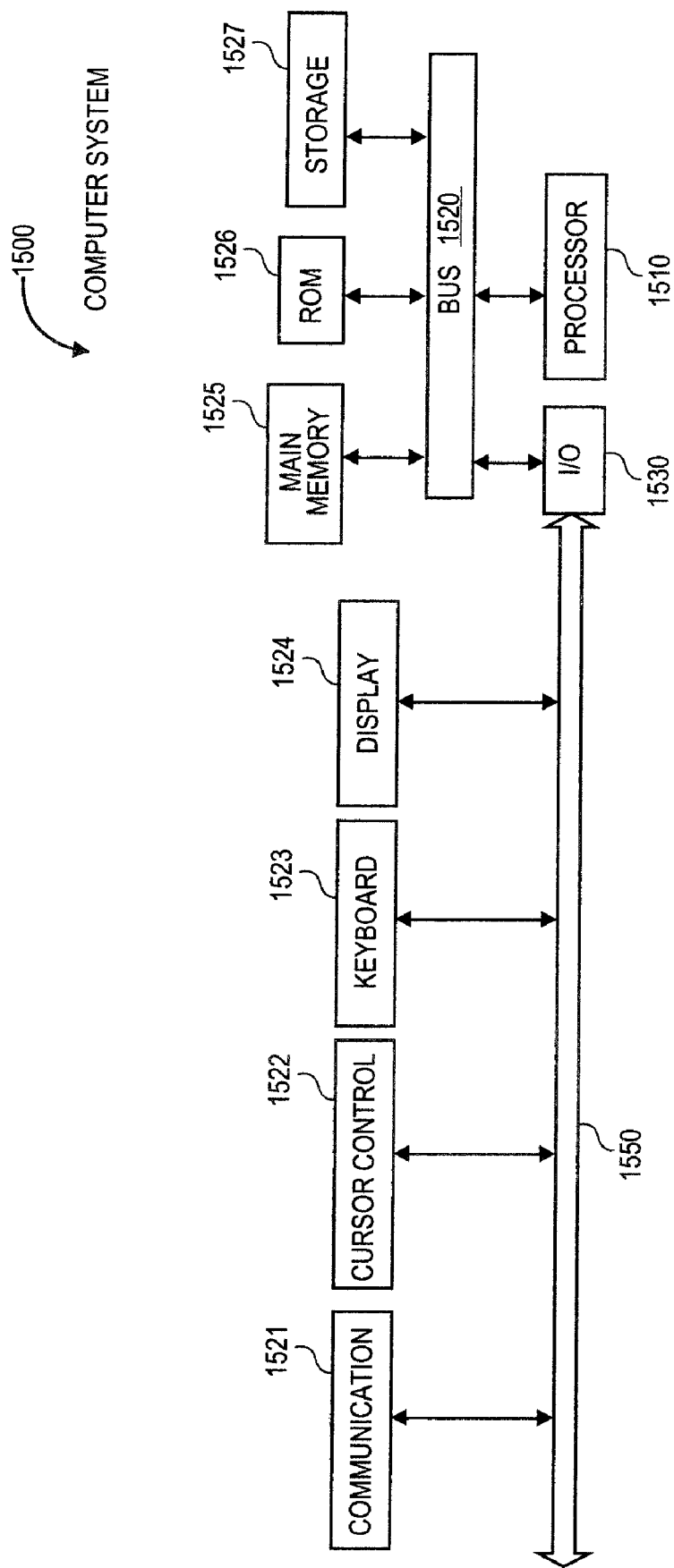
FIG. 15 illustrates a computer system on which an embodiment of the present invention may be implemented.

FIG. 15 illustrates a computer system 1500 on which an embodiment of the present invention may be implemented. Computer system 1500 includes a system bus 1520 for communicating information, and a processor 1510 coupled to bus 1520 for processing information. According to one embodiment, processor 1510 is implemented using one of the multitudes of microprocessors. Nevertheless one of ordinary skill in the art will appreciate that other processors may be used.

Computer system 1500 further comprises a random access memory (RAM) or other dynamic storage device 1525 (referred to herein as main memory), coupled to bus 1520 for storing information and instructions to be executed by processor 1510. Main memory 1525 also may be used for storing temporary variables or other intermediate information during execution of instructions by processor 1510. Computer system 1500 also may include a read only memory (ROM) and or other static storage device 1526 coupled to bus 1520 for storing static information and instructions used by processor 1510.

A data storage device 1525 such as a magnetic disk or optical disc and its corresponding drive may also be coupled to computer system 1500 for storing information and instructions. Computer system 1500 can also be coupled to a second input/output (I/O) bus 1550 via an I/O interface 1530. A plurality of I/O devices may be coupled to I/O bus 1550, including a display device 1524, an input device (e.g., an alphanumeric input device 1523 and or a cursor control device 1522). The communication device 1521 is for accessing other computers (servers or clients) via external data network. The communication device 1521 may comprise a modem, a network interface card, or other well-known interface device, such as those used for coupling to Ethernet, token ring, or other types of networks. Computer system 1500 includes, but is not limited to, a network computer device, a mobile telephone, a personal data assistant (PDA), etc.

Computer system 1500 may be interconnected in a client/server network system. A network may include a Local Area Network (LAN), Wide Area Network (WAN), Metropolitan Area Network (MAN), intranet, the Internet, etc. As stated elsewhere in this document, any number of network devices can be cascaded into being connected with a port multiplier forming a networking mechanism within a network. It is contemplated that there may be any number of devices connected via the network. A device may transfer data streams, such as streaming media data, to other devices in the network system via a number of standard and non-standard protocols, including the protocols described in this document.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments of the present invention may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

One or more modules, components, or elements described throughout this document, such as the ones shown within or associated with an embodiment of a port multiplier enhancement mechanism may include hardware, software, and/or a combination thereof. In a case where a module includes software, the software data, instructions, and/or configuration may be provided via an article of manufacture by a machine/electronic device/hardware. An article of manufacture may include a machine accessible/readable medium having content to provide instructions, data, etc. The content may result in an electronic device, for example, a filer, a disk, or a disk controller as described herein, performing various operations or executions described.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically EPROM (EEPROM), magnet or optical cards, flash memory, or other type of media/machine-readable medium suitable for storing electronic instructions. Moreover, the present invention may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method comprising:
    converting a transmission data path of a single bit into a parallel bit via a data aligner, wherein the data is transmitted via one or more ports; and
    binding data transmission channels to reduce latency in transmission of the data, wherein binding includes inserting a delay to match latency via the one or more ports, wherein the delay is inserted in an input stream of the data without having to insert a cycle delay in a port aligner.

2. The method of claim 1, further comprising aligning the data by detecting frame boundary information of the data during a channel setup period, and facilitating frame aligning using the frame boundary information.

3. The method of claim 2, further comprising generating information to compensate data skew via the one or more ports via the port aligner, the compensating of the data skew is performed based on the frame boundary information of the data.

4. The method of claim 2, wherein the frame boundary information comprises a start position of the data.

5. The method of claim 1, further comprising simultaneously performing port aligning of the data via the port aligner and frame aligning of the data via the data aligner, wherein the data aligner supports a dual stage alignment.

6. The method of claim 1, wherein the data aligner is coupled with a finite state machine to manage the data aligner globally by facilitating communication of the data aligner with external systems, the data aligner is coupled to one or more of a data path block, a control block, and a comparator array.

7. The method of claim 1, further comprising masking input to the comparator array after the channel setup period is complete.

8. An apparatus comprising:
    a mechanism for data alignment for multiple serial receivers, the mechanism including a data aligner to
    convert a transmission data path of a single bit into a parallel bit via, wherein the data is transmitted via one or more ports and
    bind data transmission channels to reduce latency in transmission of the data, wherein binding includes inserting a delay to match latency via the one or more ports, wherein the delay is inserted in an input stream of the data without having to insert a cycle delay in a port aligner.

9. The apparatus of claim 8, wherein the data aligner is further to align the data by detecting frame boundary information of the data during a channel setup period, and facilitating frame aligning using the frame boundary information.

10. The apparatus of claim 9, wherein the mechanism further comprising the port aligner to generate information to compensate data skew via the one or more ports, the compensating of the data skew is performed based on the frame boundary information of the data.

11. The apparatus of claim 8, wherein the frame boundary information comprises a start position of the data.

12. A system comprising:
    a computer system having a processor and a memory coupled to the processor, the computer system having a mechanism for data alignment for multiple serial receivers, the mechanism including a data aligner to
    convert a transmission data path of a single bit into a parallel bit via a data aligner, wherein the data is transmitted via one or more ports; and
    bind data transmission channels to reduce latency in transmission of the data, wherein binding includes inserting a delay to match latency via the one or more ports, wherein the delay is inserted in an input stream of the data without having to insert a cycle delay in a port aligner.

13. The system of claim 12, wherein the data aligner is further to align the data by detecting frame boundary information of the data during a channel setup period, and facilitating frame aligning using the frame boundary information.

14. The system of claim 12, wherein the mechanism further comprising the port aligner to generate information to compensate data skew via the one or more ports, the compensating of the data skew is performed based on the frame boundary information of the data.

15. The system of claim 13, wherein the frame boundary information comprises a start position of the data.

16. The method of claim 1, wherein binding to reduce latency further comprises reducing a number of cycles or eliminating clock-domain crossing issues by at least:
    replacing large shifters with small shifters;
    employing fewer clocks;
    removing special characters from the input stream; and
    adjusting pointer values used for frame alignment.

17. The apparatus of claim 8, wherein binding to reduce latency further comprises reducing a number of cycles or eliminating clock-domain crossing issues by at least:
    replacing large shifters with small shifters;
    employing fewer clocks;
    removing special characters from the input stream; and
    adjusting pointer values used for frame alignment.

18. The system of claim 12, wherein binding to reduce latency further comprises reducing a number of cycles or eliminating clock-domain crossing issues by at least:
  replacing large shifters with small shifters;
  employing fewer clocks;
  removing special characters from the input stream; and
  adjusting pointer values used for frame alignment.

* * * * *